United States Patent
Klein

(10) Patent No.: US 10,323,866 B1
(45) Date of Patent: Jun. 18, 2019

(54) EFFICIENCY HEAT PUMP SYSTEM

(71) Applicant: Jacob Klein, Midland, TX (US)

(72) Inventor: Jacob Klein, Midland, TX (US)

( * ) Notice: Subject to any disclaimer, the term of this patent is extended or adjusted under 35 U.S.C. 154(b) by 0 days.

(21) Appl. No.: 15/717,589

(22) Filed: Sep. 27, 2017

Related U.S. Application Data

(60) Provisional application No. 62/400,496, filed on Sep. 27, 2016.

(51) Int. Cl.
*F25B 5/04* (2006.01)
*F25B 27/00* (2006.01)
*H01L 35/32* (2006.01)

(52) U.S. Cl.
CPC .............. *F25B 27/00* (2013.01); *F25B 5/04* (2013.01); *H01L 35/32* (2013.01)

(58) Field of Classification Search
CPC .. H01L 35/32; F25B 27/00; F25B 9/06; F25B 2400/141; F25B 2400/14; F25B 5/04
See application file for complete search history.

(56) References Cited

U.S. PATENT DOCUMENTS

| | | | | |
|---|---|---|---|---|
| 9,284,951 B2 * | 3/2016 | Wang | ...................... | F01D 15/10 |
| 2007/0235325 A1 * | 10/2007 | Kamachi | ........... | H01M 8/04007 |
| | | | | 204/275.1 |
| 2012/0169067 A1 * | 7/2012 | Ruan | ........................ | F24H 4/06 |
| | | | | 290/1 R |
| 2015/0059342 A1 * | 3/2015 | Kruger | ...................... | F01K 3/12 |
| | | | | 60/650 |
| 2015/0214458 A1 * | 7/2015 | Nandigama | ......... | F02B 29/0406 |
| | | | | 60/599 |

\* cited by examiner

*Primary Examiner* — Cassey D Bauer
(74) *Attorney, Agent, or Firm* — Eldredge Law Firm; Richard Eldredge

(57) ABSTRACT

A heat pump system includes a shared motor having a common shaft; a thermoelectric generator conductively coupled to the shared motor, the thermoelectric generator is configured to provide electricity to the shared motor; a high-temperature compressor rotatably attached to the common shaft, the high-temperature compressor is configured to rotate the shared motor via the shared shaft and configure to channel heated fluid to the thermoelectric generator; a low-temperature compressor rotatably attached to the common shaft, the low-temperature compressor is configured to rotate the shared motor via the shared shaft and configure to channel cooled fluid to the thermoelectric generator; a first evaporation core in fluid communication with the thermoelectric generator; and a second evaporation core in fluid communication with the first evaporation core and in fluid communication with the high-temperature compressor.

1 Claim, 3 Drawing Sheets

EFFICIENCY HEAT PUMP SYSTEM

BACKGROUND

1. Field of the Invention

The present invention relates generally to mechanical systems, and more specifically, to an air-conditioning system for reducing the temperature of an air flow by transferring the heat to another fluid.

2. Description of Related Art

Mechanical systems are well known in the art and are effective means to arrange physical processes in order to accomplish a task. For example, FIG. 1 depicts a conventional air-conditioning system 101 having a compressor 103, a condenser 105, and an evaporator 107, all of which are connected via tubing 109 filled with refrigerant 111. During use, the compressor 105 increases the pressure on refrigerant 111 to facilitate the condenser 103 phase-changing the refrigerant 111 from gas to liquid and the evaporator 107 phase-changing the refrigerant 111 from liquid to gas. Temperature changes (not shown) resulting from the phase-changes of refrigerant 111 are transferred away from the system via one or more air flows (not shown).

One of the problems commonly associated with system 101 is its limited efficiency. For example, energy is constantly consumed by the systems components, namely the compressor 103, condenser 105 and evaporator 107.

Accordingly, although great strides have been made in the area of air-conditioning systems, many shortcomings remain.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
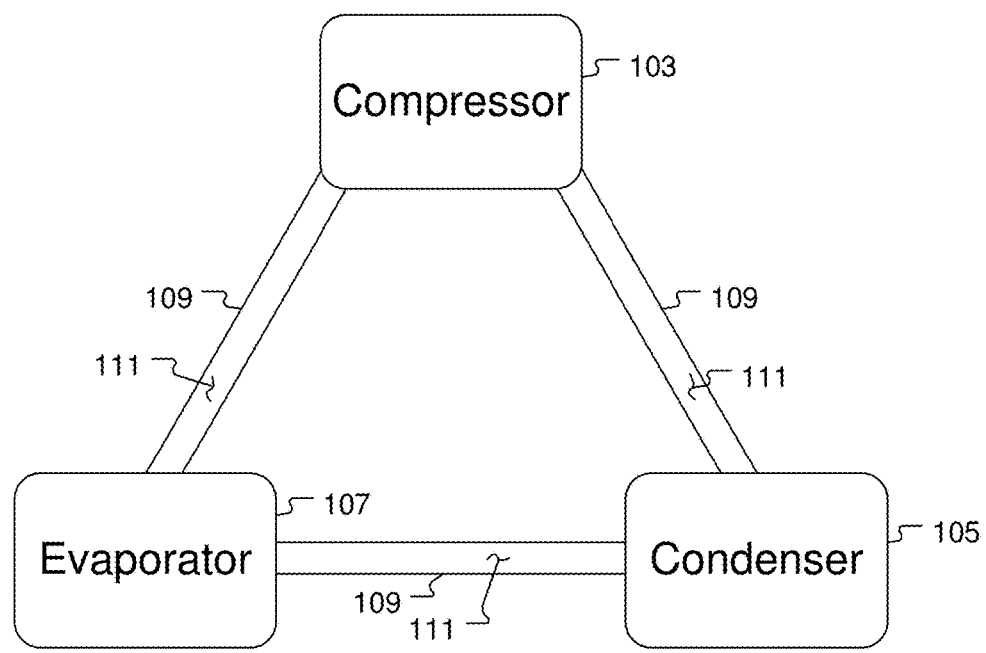
FIG. 1 is a simplified schematic of a common air-conditioning system.

While the system and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of use in accordance with the present application overcomes one or more of the above-discussed problems commonly associated with conventional air-conditioning systems. Specifically, the system of the present application provides means to recapture energy traditionally lost from the system to enhance operation efficiency. These and other unique features of the system and method of use are discussed below and illustrated in the accompanying drawings.

The system and method of use will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2:
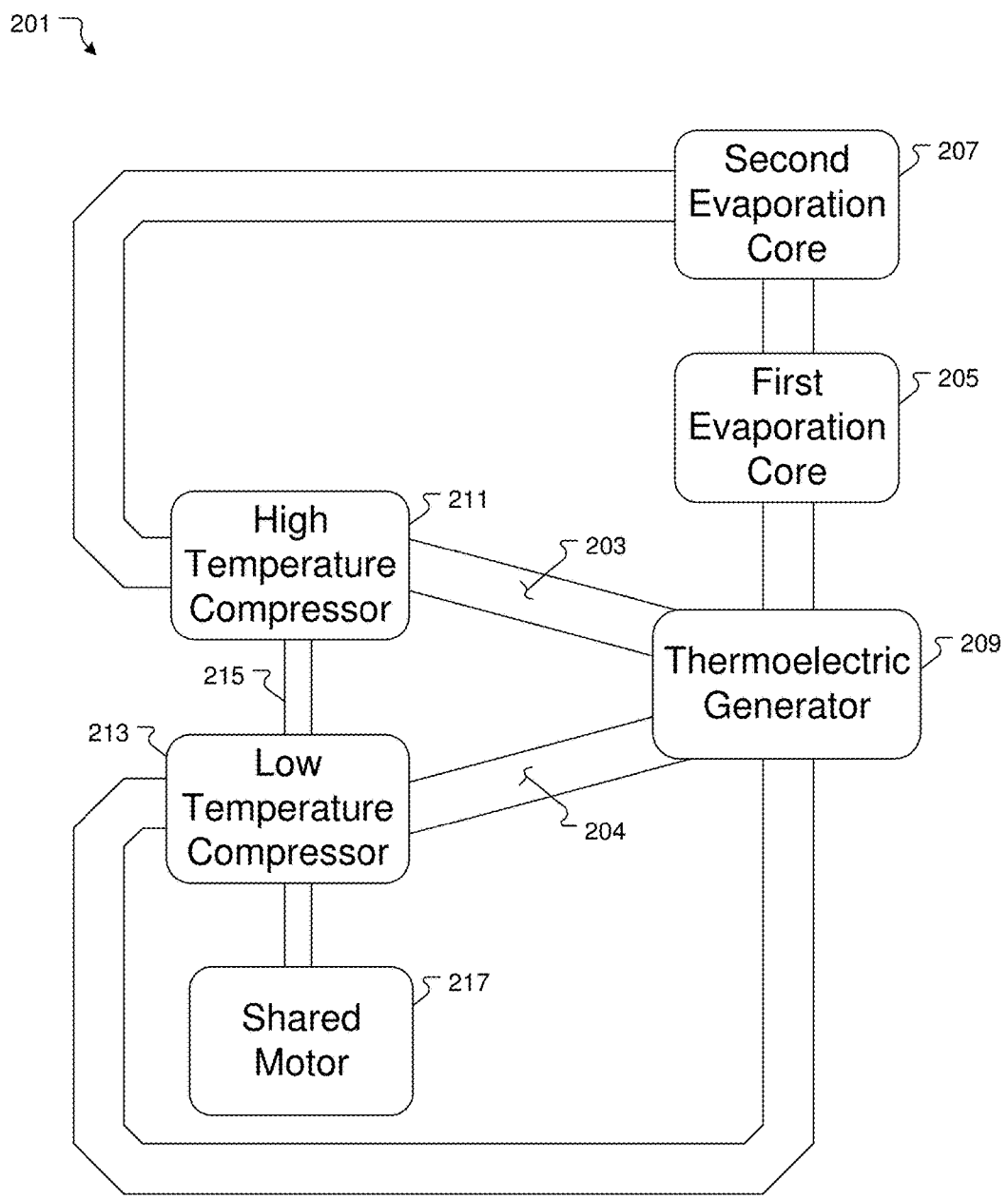
FIG. 2 is a simplified schematic of an improved efficiency heat pump system in accordance with a preferred embodiment of the present application.

Referring now to the drawings wherein like reference characters identify corresponding or similar elements throughout the several views, FIG. 2 depicts a simplified schematic of an improved efficiency heat pump system in accordance with a preferred embodiment of the present application. It will be appreciated that system 201 overcomes one or more of the above-listed problems commonly associated with conventional air-conditioning systems.

In the contemplated embodiment, system 201 comprises one or more heated and cooled refrigerant flows 203, 204, first and second evaporation cores 205, 207, one or more thermoelectric generators 209, and a high-temperature compressor 211 in communication with one or more low-temperature compressors 213 via one or more shared shafts 215 and one or more shared motors 217. During use, compressors 211 and 213 respectively pump refrigerant flows 203 and 204 to opposing sides of generator 209 to create a temperature differential that enables generator 209 to produce electricity (not shown) and thereby assist in moving the motor 217 via shared shaft 215. (See FIG. 3). Flow 203 then proceeds to compressor 213 and flow 204 proceeds to compressor 211 via evaporation cores 205, 207 to renew the cycle.

It should be appreciated that one of the unique features believed characteristic of the present application is that thermoelectric generator 209 recaptures energy from the system to increase operational efficiency by partially powering motor 217.

Figure 3:
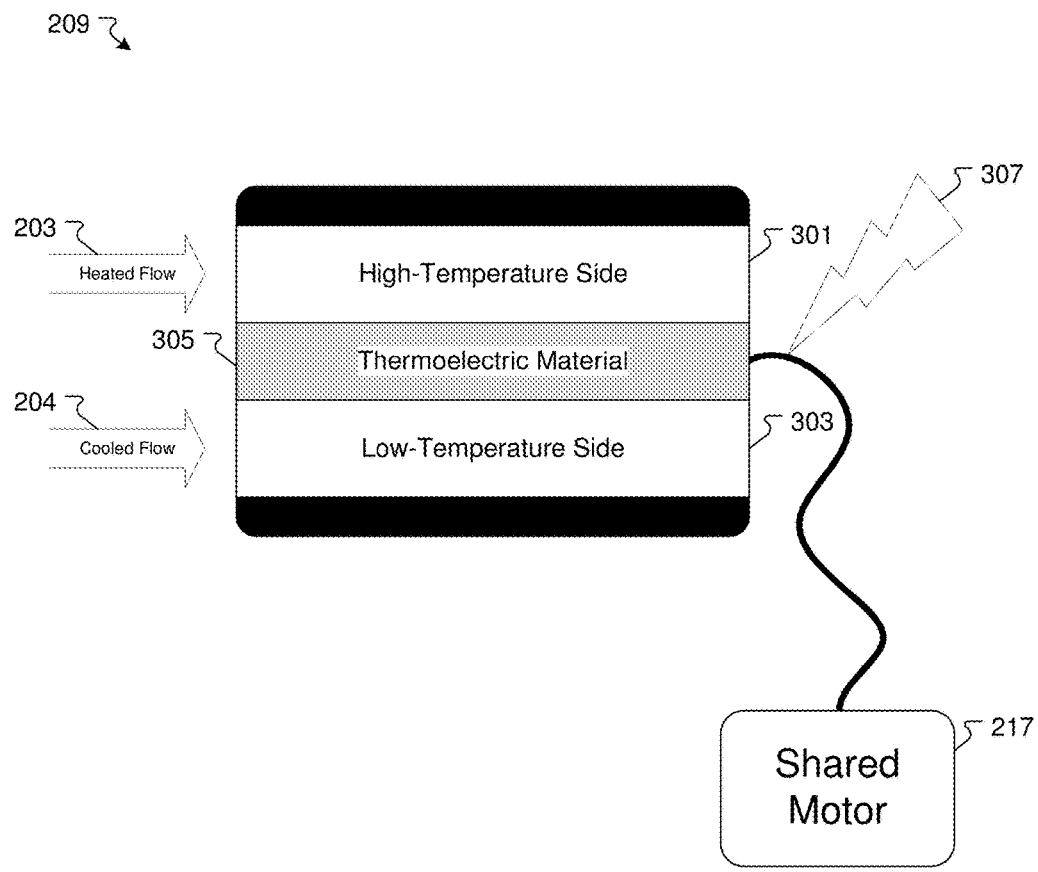
FIG. 3 is a simplified schematic of the generator and flow of FIG. 2.

Referring now to FIG. 3 a simplified side view of thermoelectric generator 209 is depicted, the generator comprising a heated flow 203 and a cooled flow 204 that respectively pass through a high temperature side 301 and a low temperature side 303, wherein sides 301 and 303 are separated by thermoelectric material 305 that generates electricity 307 in response to the temperature differential experienced by flows 203, 204 on its sides 301, 303. It is understood and will be appreciated that generator 209 is configured to enhance the operational efficiency of motor 217 via electricity 307, wherein the thermoelectric generator is conductively coupled to the shared motor 217, as depicted in FIG. 3.

Another unique feature believed characteristic of the present application is that high-temperature compressor 211 and low-temperature compressor 213 operate on shared shaft 215 via shared motor 217 to increase efficiency. It will be understood and appreciated that compressors 211, 213 are sized and situated to enable this configuration. It will also be appreciate that low-temperature compressor 213 functions as a decompressor for flow 204 further extracting energy from the flow 204. It will also be appreciated that monitoring the temperature of evaporation cores 205 and 207 by a sensor (not shown) is common in the art and facilitates the proper functioning of the system 201.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A heat pump system, comprising:
   a shared motor having a common shaft;
   a thermoelectric generator conductively coupled to the shared motor, the thermoelectric generator is configured to provide electricity to the shared motor, the thermoelectric generator having:
      a high-temperature side;
      a low-temperature side; and
      a thermoelectric material disposed between the high-temperature side and the low-temperature side;
   a high-temperature compressor rotatably attached to the common shaft, the high-temperature compressor is configured to rotate the shared motor via the shared shaft and configured to channel heated fluid to the thermoelectric generator;
   a low-temperature decompressor rotatably attached to the common shaft, the low-temperature decompressor is configured to rotate the shared motor via the shared shaft and configured to channel cooled fluid to the thermoelectric generator;
   a first evaporation core in fluid communication with the thermoelectric generator; and
   a second evaporation core in fluid communication with the first evaporation core and in fluid communication with the high-temperature compressor.

\* \* \* \* \*